US 12,099,902 B2

(12) United States Patent
Noguchi et al.

(10) Patent No.: US 12,099,902 B2
(45) Date of Patent: Sep. 24, 2024

(54) QUANTUM GATE DEVICE (71) Applicant: JAPAN SCIENCE AND TECHNOLOGY AGENCY, Kawaguchi (JP)

(72) Inventors: Atsushi Noguchi, Koganei (JP); Yasunobu Nakamura, Tsukuba (JP)

(73) Assignee: JAPAN SCIENCE AND TECHNOLOGY AGENCY, Kawaguchi (JP)

(*) Notice: Subject to any disclaimer, the term of this patent is extended or adjusted under 35 U.S.C. 154(b) by 490 days.

(21) Appl. No.: 17/629,718

(22) PCT Filed: Feb. 28, 2020

(86) PCT No.: PCT/JP2020/008489
§ 371 (c)(1),
(2) Date: Jan. 24, 2022

(87) PCT Pub. No.: WO2021/029095
PCT Pub. Date: Feb. 18, 2021

(65) Prior Publication Data
US 2022/0269968 A1    Aug. 25, 2022

(30) Foreign Application Priority Data

Aug. 9, 2019   (JP) ................................. 2019-148136

(51) Int. Cl.
*G06N 10/40* (2022.01)
*G06N 10/20* (2022.01)
*H10N 60/12* (2023.01)

(52) U.S. Cl.
CPC ............. *G06N 10/40* (2022.01); *G06N 10/20* (2022.01); *H10N 60/12* (2023.02)

(58) Field of Classification Search
USPC ........................................................ 716/100
See application file for complete search history.

(56) References Cited

U.S. PATENT DOCUMENTS

2022/0103172 A1* 3/2022 Mundhada ............. G06N 10/40

FOREIGN PATENT DOCUMENTS

| WO | 2017/115160 A1 | 7/2017 |
| WO | 2017/127205 A1 | 7/2017 |
| WO | 2018/162965 A1 | 9/2018 |

OTHER PUBLICATIONS

May 19, 2020 Written Opinion issued in International Patent Application No. PCT/JP2020/008489.

(Continued)

*Primary Examiner* — Bryce M Aisaka
(74) *Attorney, Agent, or Firm* — Oliff PLC (57) ABSTRACT

A quantum gate device includes a first superconducting circuit which resonates at a first resonance frequency, second superconducting circuit which resonates at a second resonance frequency, and connector which connects these circuits. The first superconducting circuit includes a single first Josephson device, second Josephson device group, and first capacitor. The second Josephson device group includes n Josephson devices connected by a line made of a superconductor. The Josephson energy possessed by each of the n Josephson devices is greater than n times that of the first Josephson device. The quantum gate device further includes a magnetic field applier which applies a static magnetic field to the partial superconducting circuit, and an electromagnetic wave irradiator (first electromagnetic wave irradiator) which irradiates the first superconducting circuit and/or second superconducting circuit with an electromagnetic wave having a difference frequency which is equal to the difference between the first and second resonance frequencies.

10 Claims, 7 Drawing Sheets

(56) References Cited

OTHER PUBLICATIONS

Koch et al.; "Charge-insensitive qubit design derived from the Cooper pair box"; Physical Review A; Oct. 2007; vol. 76; pp. 042319-1 to 042319-19. DOI: 10.1103/PhysRevA.76.042319.
May 19, 2020 International Search Report issued in International Patent Application No. PCT/JP2020/008489.

* cited by examiner

Fig. 4A
SWAP GATE, iSWAP GATE

Fig. 4B
CZ GATE

QUANTUM GATE DEVICE

TECHNICAL FIELD

The present invention relates to a quantum gate device which is a component of a quantum computer.

BACKGROUND ART

In recent years, research and developments for quantum computers have been actively conducted. In conventional computers, a piece of data represented by one of the binary values (normally, "0" and "1") is used as the minimum unit to perform computations. By contrast, in quantum computers, a superposition of two states handled in quantum mechanics is used as the minimum unit to perform computations, which is expected to improve the computing capability.

Conventional computers perform operations called a "logic gate", in which logical multiplication (AND), logical addition (OR), logical negation (NOT) and other logical operations are performed on input data, to obtain a result as an output. Quantum computers also perform similar operations, called a "quantum gate", in which logical operations are performed on input data to obtain a result as an output. A device which performs such operations is called a "quantum gate device". As a prerequisite for realizing a superposition of two states, it is necessary for quantum gate devices to selectively take two states from a large number of quantum-mechanically discretized states (and will not take any state other than the two states).

Non Patent Literature 1 discloses a circuit called the "transmon" which is a component of a quantum gate device. The transmon is a circuit in which one Josephson device and one capacitor are connected in a ring-like form by a line made of a superconductor. The Josephson device consists of two superconductors between which a thin film of an insulator is sandwiched.

When the quantum gate device is cooled to a temperature at which the superconductors in the Josephson device and the line make a transition to a superconducting state, an electric current due to the Josephson effect flows within the transmon, passing through the Josephson device. This makes the transmon function as a resonance circuit. Due to quantum mechanical effects, this resonance circuit takes one of a plurality of discretized energy states. Since the Josephson device is present in this resonance circuit, the plurality of energy states occur at irregular intervals. Accordingly, an electromagnetic wave whose energy level corresponds to the smallest interval is injected into the Josephson device. This enables the transmon to selectively take only two energy states: the ground state and one excited state (if the Josephson device is removed from the transmon, the energy states in the remaining circuit occur at regular intervals, which allows the transmon to take three or more energy states when an electromagnetic wave whose energy level corresponds to that interval is injected). A quantum gate device is constructed by combining a plurality of transmons each of which takes only two energy states in the previously described manner, or by combining one or more transmons with another circuit.

CITATION LIST

Non Patent Literature

Non Patent Literature 1: J. Koch and nine other authors, "Charge insensitive qubit design derived from the Cooper pair box", *Physical Review A*, (USA), issued by American Physical Society, Oct. 12, 2007, Vol. 76, paper No. 042319

SUMMARY OF INVENTION

Technical Problem

In quantum gate devices, the energy state created by the quantum mechanical effect can be maintained for only a limited period of time (the mean value of this period of time is called the "coherence time"). Therefore, the rate of occurrence of operation errors becomes high if the operation requires a considerable amount of time. Quantum computers are provided with the function of correcting an error when such an error has occurred in the quantum gate device. However, having a lower rate of occurrence of errors, i.e., having a shorter operation time, leads to a higher performance since the amount of processing for error correction is reduced. Understandably, the shortened operation time itself also contributes to an improvement in the performance of the quantum computer. To this end, it is preferable to shorten the period of time for the transition from one energy state to the other in the quantum gate device.

The problem to be solved by the present invention is to provide a quantum gate device that can make a high-speed transition between two energy states, from one energy state to the other.

Solution to Problem

A quantum gate device according to the present invention developed for solving the previously described problem includes:
  a) a first superconducting circuit configured to resonate at a first resonance frequency, the first superconducting circuit including:
    a-1) a first Josephson device which is a single Josephson device;
    a-2) a second Josephson device group in which n Josephson devices are connected in series by a line made of a superconductor, where each of the n Josephson devices has a Josephson energy greater than n times a Josephson energy of the first Josephson device;
    a-3) a first capacitor; and
    a-4) a first line made of a superconductor and configured to form a partial superconducting circuit by connecting the first Josephson device and the second Josephson device group in a ring-like form, as well as to connect the partial superconducting circuit and the first capacitor in parallel;
  b) a second superconducting circuit configured to resonate at a second resonance frequency, including at least one Josephson device, a second capacitor, and a second line made of a superconductor;
  c) a connector configured to connect the first superconducting circuit and the second superconducting circuit, including a connector capacitor as well as a third line made of a superconductor and connected to each of the two poles of the connector capacitor;
  d) a magnetic field applier configured to apply a static magnetic field to the partial superconducting circuit; and
  e) an electromagnetic wave irradiator configured to irradiate the first superconducting circuit with an electromagnetic wave having a difference frequency which is equal to the difference between the first resonance frequency and the second resonance frequency.

The quantum gate device according to the present invention has a circuit configured in such a manner that two superconducting circuits, i.e., the first superconducting circuit and the second superconducting circuit, are connected by the connector. Each of the two superconducting circuits functions as a qubit which has one bit of information, as will be described later. A quantum gate device having two qubits as in the present invention is generally called a "two-qubit gate device".

The first superconducting circuit has the partial superconducting circuit and the first capacitor, where the partial superconducting circuit includes the first Josephson device and the second Josephson device group connected in a ring-like form by the first line. A static magnetic field is applied from the magnetic field applier to the partial superconducting circuit (starting from a state with no magnetic field applied), whereby an electric current is generated within the first superconducting circuit. With this static magnetic field maintained, the first superconducting circuit is made to function as a resonance circuit. Provided that the Josephson devices of the second Josephson device group are identical, the inductance energy U possessed by the partial superconducting circuit in this situation is expressed as:

$$U(\phi) = -E_{J1}\cos(\phi) - nE_{J2}\cos((\Phi_{ex} - \phi)/n) \quad (1)$$

where $E_{J1}$ represents the Josephson energy of the first Josephson device, and $E_{J2}$ represents the Josephson energy of each of the second Josephson devices. $\Phi_{ex}$ is defined as $\Phi_{ex} = 2\pi\Phi/\Phi_0$, where $\Phi$ is the magnetic flux injected into the partial superconducting circuit by the static magnetic field applied by the magnetic field applier, and $\Phi_0$ is a constant called the flux quantum. The magnetic flux $\Phi_0$ is expressed as $\Phi_0 = h/2e$, using the Planck constant h and the elementary charge e. $\phi$ represents the phase difference between the two superconductors in the first Josephson device. Equation (1) can be approximated as follows by a Tailor expansion around the point where $U(\phi)$ takes the smallest value:

$$U(\phi) \sim a_2\phi^2 + a_3\phi^3 + a_4\phi^4 \quad (2)$$

where $a_2$, $a_3$ and $a_4$ are constants. Thus, the first superconducting circuit has the term of $\phi^3$ in addition to the terms of $\phi^2$ and $\phi^4$ in its inductance energy. On the other hand, in the case of the transmon described earlier, since it has only a single Josephson device, its inductance energy is represented by a Tailor expansion of a cosine function, which is approximated by the sum of the terms of $\phi^2$ and $\phi^4$ without the term of $\phi^3$.

Since the inductance energy U of the first superconducting circuit has the term of $\phi^3$, the quantum gate device according to the present invention produces the following effects: In general, simply connecting two qubits does not give rise to the coupling of the two qubits (they merely operate individually) since their resonance frequencies are different, so that they do not function as a two-qubit gate device. By contrast, in the quantum gate device according to the present invention, since the inductance energy U of the first superconducting circuit has the term of $\phi^3$, the resonance frequency can be modulated by applying an oscillating electric field from outside the first superconducting circuit. As this oscillating electric field for irradiating the first superconducting circuit, the electromagnetic wave irradiator uses an electromagnetic wave having a difference frequency $|\omega 2 - \omega 1|$, i.e., the difference between the first oscillation frequency (denoted by $\omega 1$) which is the oscillation frequency of the first superconducting circuit (without the oscillating electric field) and the second oscillation frequency (denoted by $\omega 2$) which is the oscillation frequency of the second superconducting circuit. The resonance frequency is thereby modulated, and the first and second superconducting circuits oscillate and interact with each other. Thus, the quantum gate device according to the present invention functions as a two-qubit gate device.

In order to express the inductance energy of the first superconducting circuit by a Tailor expansion as in equation (2), $U(\phi)$ in equation (1) must have only a single local minimum within a range of $-n\pi < \phi < n\pi$ for any value of $\Phi_{ex}$. To meet this requirement, each of the n Josephson devices constituting the second Josephson device group (those Josephson devices are hereinafter collectively called "each second Josephson device") must have a Josephson energy greater than n (i.e., the number that is equal to the number of Josephson devices constituting the second Josephson device group) times the Josephson energy of the first Josephson device. It should be noted that the Josephson energy is the energy for the tunnel coupling between the two superconductors included in the Josephson device.

In the first superconducting circuit, the energy is discretized due to the quantum mechanical effect, and the energy interval between the neighboring energy states varies. Therefore, it is possible to select two energy states with the smallest energy interval and induce a transition between the two states. In the following description, the lower one of the two energy states in the first superconducting circuit is called the ground state, denoted by "g1", and the higher one is called the first excited state, denoted by "e1". The first superconducting circuit represents one bit of information by these two energy states.

As the second superconducting circuit, for example, the previously described transmon, as well as the charge qubit, flux qubit or fluxonium which will be described later, can be used. Among these examples, the transmon is preferable in that it has a longer coherence time than the other options. The second superconducting circuit includes at least one Josephson device, a second capacitor and a second line made of a superconductor. Due to the non-linearity of the Josephson device, a plurality of energy states occur at irregular intervals, among which the circuit can selectively take two energy states neighboring each other with the smallest energy interval (of which the lower one is called the ground state, denoted by "g2", and the higher one is called the first excited state, denoted by "e2"). The second superconducting circuit represents one bit of information by these energy states.

As one example of the operation of the quantum gate in the quantum gate device according to the present invention, an operation called the "SWAP gate" is hereinafter described. In the case where the combination of the energy states of the first and second superconducting circuits is one of the two states "g1e2" and "e1g2", the electromagnetic wave irradiator irradiates the first superconducting circuit with an electromagnetic wave having a difference frequency $|\omega 2 - \omega 1|$. During the irradiation with this electromagnetic wave of the aforementioned difference frequency, the combination of the energy states in the quantum gate device alternates between "g1e2" and "e1g2" with a specific period of time. Therefore, by performing the irradiation with the electromagnetic wave for a half-integral multiple of that period, the device can be changed from one of the two states "g1e2" and "e1g2" to the other state. This type of operation corresponds to an exchange of the ground state (g1 or g2) and the first excited state (e1 or e2) between the first and second superconducting circuits, and therefore, is called the "SWAP gate".

Additionally, in the quantum gate device according to the present invention, the phase of the electromagnetic wave for irradiating the first superconducting circuit and/or the second superconducting circuit can be changed by 90 degrees to exchange the ground state (g1 or g2) and the first excited state (e1 or e2) between the first and second superconducting circuits as well as to invert the phase in one of the first and second superconducting circuits; i.e., it is possible to invert "g1e2" to "ie1g2" (where i is the imaginary unit) as well as "e1g2" to "ig1e2". This type of operation of the quantum gate is generally called the "iSWAP gate".

Furthermore, in the case where the combination of the energy states in the quantum gate device is "e1e2", when the first superconducting circuit and/or the second superconducting circuit is irradiated with an electromagnetic wave having a difference frequency $|\omega 2-\alpha 2-\omega 1|$, the device alternately takes the two states "e1e2" and "g1f2", where "f2" means that the second superconducting circuit takes a second excited state which is the second highest energy state next to the first excited state, while $\omega 2-\alpha 2$ means a resonance frequency resulting from a resonance between the "f2" state and the "e2" state (in this case, this resonance frequency is selected as the second resonance frequency mentioned earlier). By temporarily changing "e1e2" to "g1f2" by this operation and then further continuing the irradiation to return it to the original state, the state receives a phase of 180 degrees and changes to "−e1e2". This type of operation is called the "CZ gate".

As described to this point, the quantum gate device according to the present invention can be operated to function as one, two or all (three) of the three types of quantum gates, i.e. the SWAP gate, iSWAP gate and CZ gate.

Conventional two-qubit gate devices (e.g., a device including two transmons combined together) require more than 100 nanoseconds for the transition from one energy state to the other energy state. On the other hand, an experiment using a quantum gate device according to the present invention fabricated as will be described later has demonstrated that the transition between two energy states can be achieved with approximately 16 nanoseconds, which is shorter than the conventionally required time. One reason for the successful reduction of the period of time for the transition between two energy states is that the inductance energy $U(\phi)$ of the partial superconducting circuit has a non-linear and low-order term of $\phi^3$, which strengthens the interaction between the first and second superconducting circuits.

There is no specific limitation on the strength of the static magnetic field as long as it is weaker than the weakest magnetic field which can break the superconducting state of the superconductors included in each Josephson device (the first Josephson device and each second Josephson device) as well as that of the superconductor used for the first line included in the partial superconducting circuit. In practice, the magnetic field should preferably have a strength that generates, in the partial superconducting circuit, a flux equal to or less than the flux quantum multiplied by 5, and more preferably, a strength that generates, in the partial superconducting circuit, a flux equal to or less than the flux quantum multiplied by 1.

The superconductors respectively included in the first Josephson device, each second Josephson device, first line, second line and third line may be of the same kind, or of different kinds. Similarly, the insulators used for the junction in the first Josephson device and the junction in each second Josephson device may also be of the same kind, or of different kinds.

In the case where a device in which a junction having a first thin film made of an insulator is sandwiched between two superconductors is used as the first Josephson device while a device in which a junction having a second thin film made of the same insulator as the first thin film is sandwiched between two superconductors is used as each second Josephson device, it is preferable that the value of the tunnel resistance in the first Josephson device be greater than n times the value of the tunnel resistance in each second Josephson device. This makes the Josephson energy of each second Josephson device greater than n times the Josephson energy of the first Josephson device. The tunnel resistance (R) is given by dividing the value (V) of a voltage applied to the junction by the value (I) of the current which flows across the junction (R=V/I).

The electromagnetic wave irradiator may irradiate the second superconducting circuit with the electromagnetic wave in addition to the first superconducting circuit.

In general, in a quantum gate device configured to perform an operation as a quantum gate using two superconducting circuits, after an operation of the quantum gate has been performed, an unwanted interaction called a "residual interaction" possibly occurs between the electrons possessed by one of the superconducting circuits and those possessed by the other superconducting circuit, making it impossible to maintain the state created by the operation of the quantum gate. Accordingly, it is preferable for the quantum gate device according to the present invention to further include:

a residual-interaction-cancelling electromagnetic wave irradiator configured to irradiate the first superconducting circuit with a residual-interaction-cancelling electromagnetic wave which is an electromagnetic wave which inverts the phase of a qubit; and an irradiation coordinator configured to coordinate the timing of irradiation by the electromagnetic wave irradiator and the residual-interaction-cancelling electromagnetic wave irradiator so that an irradiation with the electromagnetic wave by the electromagnetic wave irradiator is performed, and subsequently, an irradiation with the residual-interaction-cancelling electromagnetic wave by the residual-interaction-cancelling electromagnetic wave irradiator is performed two times with a predetermined interval of time.

In the quantum gate device according to the present invention which includes the residual-interaction-cancelling electromagnetic wave irradiator and the irradiation coordinator, after the first superconducting circuit has been irradiated with the electromagnetic wave having the difference frequency by the electromagnetic wave irradiator to perform an operation of the quantum gate, only one of the first and second superconducting circuits is irradiated two times with the residual-interaction-cancelling electromagnetic wave which inverts the phase of the qubit. As a result of the first irradiation with the residual-interaction-cancelling electromagnetic wave, the phase of the qubit is inverted in only one of the first and second superconducting circuits irradiated with the residual-interaction-cancelling electromagnetic wave, whereby the residual interaction that occurs between electrons possessed by the first superconducting circuit and those possessed by the second superconducting circuit is broken. Subsequently, the second irradiation with the residual-interaction-cancelling electromagnetic wave further inverts the phase of the qubit in the superconducting circuit irradiated with the residual-interaction-cancelling electromagnetic wave, whereby the original state created by the operation of the quantum gate is restored. By the operations described to this point, the influence of the residual interaction can be eliminated, and the state created by the operation of the quantum gate can be maintained.

As an example of the residual-interaction-cancelling electromagnetic wave, a pulsed electromagnetic wave called a "π pulse" or "180-degree pulse" can be used, which has conventionally been used for a spin echo method in a magnetic resonance measurement. In this case, the phase of the qubit can be inverted by appropriately setting the pulse width (duration) according to the frequency and amplitude intensity of the pulsed electromagnetic wave.

There is no specific limitation on the predetermined interval of time mentioned earlier. It can be optimized by performing a preliminary experiment as will be described later. There is also no specific limitation on the interval of time between the irradiation with the electromagnetic wave by the electromagnetic wave irradiator and the first irradiation with the residual-interaction-cancelling electromagnetic wave.

The residual-interaction-cancelling electromagnetic wave irradiator may be the same device as the electromagnetic wave irradiator. Since the electromagnetic wave irradiator and the residual-interaction-cancelling electromagnetic wave irradiator perform electromagnetic-wave irradiation with different timings, it is possible to use the same device as both the electromagnetic wave irradiator and the residual-interaction-cancelling electromagnetic wave irradiator when it is the first superconducting circuit that should be irradiated with the residual-interaction-cancelling electromagnetic wave. This makes the quantum gate device simpler in configuration. Alternatively, the electromagnetic wave irradiator and the residual-interaction-cancelling electromagnetic wave irradiator may be devices separate from each other.

The residual-interaction-cancelling electromagnetic wave irradiator may be configured to irradiate the second superconducting circuit with the residual-interaction-cancelling electromagnetic wave in addition to the first superconducting circuit.

Advantageous Effects of Invention

The quantum gate device according to the present invention can make a high-speed transition between two energy states, from one energy state to the other.

DESCRIPTION OF EMBODIMENTS

Embodiments of the quantum gate device according to the present invention are hereinafter described using FIGS. 1 through 11A-C.

Figure 1:
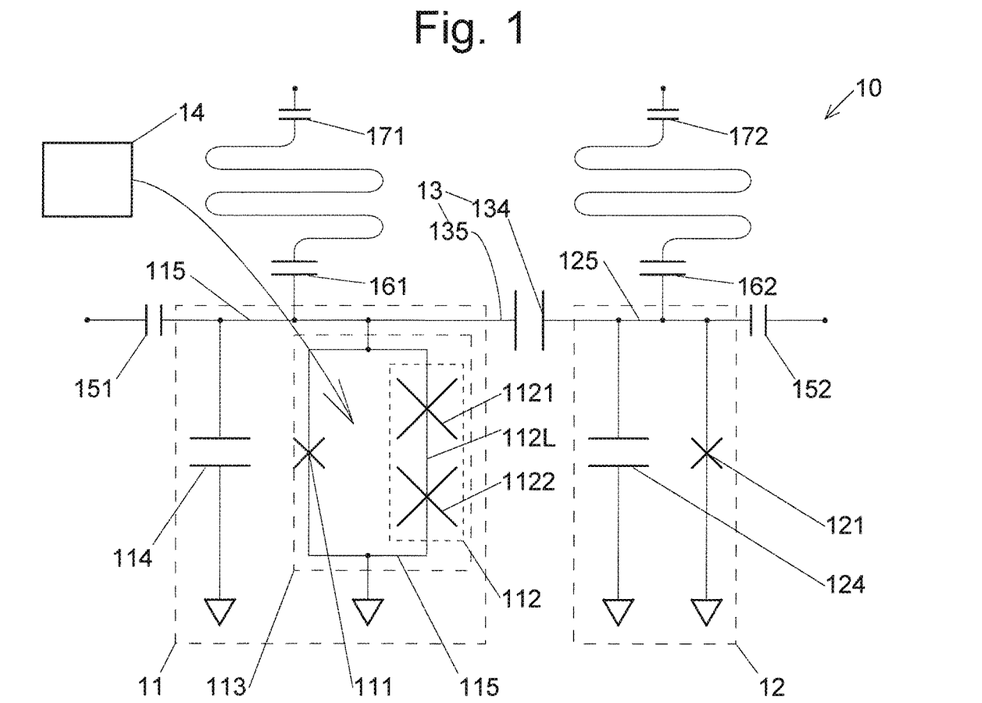
FIG. 1 is a schematic configuration diagram showing the first embodiment of the quantum gate device according to the present invention.

(1) Configuration of Quantum Gate Device According to First Embodiment of Present Invention FIG. 1 is a diagram showing a schematic of the configuration of a quantum gate device 10 according to the first embodiment of the present invention. This quantum gate device 10 includes a first superconducting circuit 11, second superconducting circuit 12, connector 13, magnetic field applier 14, first electromagnetic wave irradiator 151, and second electromagnetic wave irradiator 152. The first electromagnetic wave irradiator 151 in the first embodiment corresponds to the "electromagnetic wave irradiator" in the present invention. The second electromagnetic wave irradiator 152 is provided for testing the operation of the quantum gate device 10.

The first conducting circuit 11 includes a first Josephson device 111, second Josephson device group 112, first capacitor 114, and first line 115.

Figure 2A:
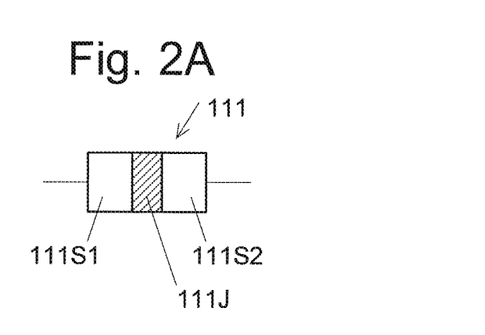
FIG. 2A is a diagram showing a first Josephson device included in the quantum gate device according to the first embodiment.
Figure 2B:
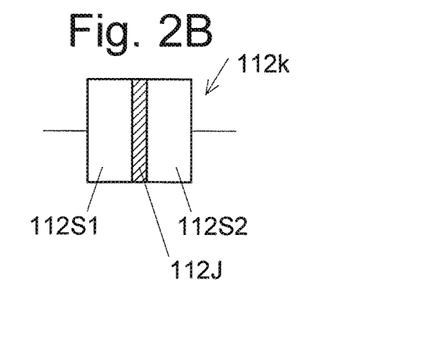
FIG. 2B is a diagram showing a second Josephson device included in the quantum gate device according to the first embodiment.

The first Josephson device 111 is a device in which a junction having a first thin film 111J made of an insulator is sandwiched between two superconductors 111S1 and 111S2 (FIG. 2A). The second Josephson device group 112 includes n second Josephson devices 1121, 1122, ..., 112n (where n is an integer equal to or greater than two) connected in series by a line 112L made of a superconductor. Although FIG. 1 shows an example with n=2, the value of n may be any integer equal to or greater than three. Each second Josephson device 112k (where k represents integers ranging from 1 to n) is a device in which a junction having a second thin film 112J made of the same kind of insulator as the first thin film 111J is sandwiched between two superconductors 112S1 and 112S2 (FIG. 2B). The thicknesses and areas of the first and second thin films 111J and 112J are designed so that the value of the tunnel resistance in the first Josephson device 111 becomes greater than n times the value of the tunnel resistance in each second Josephson device 111k. By this setting, the Josephson energy of each second Josephson device 112k is made to be greater than n times the Josephson energy of the first Josephson device 111.

The first Josephson device 111 and the second Josephson device group 112 are connected in a ring-like form by the first line 115, whereby a partial superconducting circuit 113 is formed. Furthermore, the partial superconducting circuit 113 and the first capacitor 114 are connected in parallel by the first line 115.

The previously described configuration enables the first superconducting circuit 11 to function as a resonance circuit. The resonance frequency of the first superconducting circuit 11 is hereinafter called the "first resonance frequency $\omega 1$". For example, the first resonance frequency $\omega 1$ approximately has a value of $2\pi \times 4$ GHz to $2\pi \times 8$ GHz.

The second superconducting circuit 12 used in the first embodiment is a transmon. This second superconducting circuit 12 is a circuit in which one Josephson device 121 and one second capacitor 124 are connected in a ring-like form by a second line 125 made of a superconductor. The second superconducting circuit 12 is a resonance circuit, whose resonance frequency is hereinafter called the "second resonance frequency". The second superconducting circuit 12 has two possible forms of resonance, i.e., a resonance between the ground state g2 and the first excited state e2 as well as a resonance between the first excited state e2 and the second excited state f2. The resonance frequency in the former resonance is denoted by $\omega 2$, while the resonance frequency in the latter resonance is denoted by $\omega 2-\alpha 2$. Each of these resonance frequencies is hereinafter called the "second resonance frequency". For example, the second resonance frequency $\omega 2$ approximately has a value of $2\pi \times 4$ GHz to $2\pi \times 8$ GHz.

The connector 13, which connects the first and second superconducting circuits 11 and 12, has a connector capacitor 134 and a third line 135 made of a superconductor.

The magnetic field applier 14 is configured to apply a static magnetic field to the partial superconducting circuit 113. There is no specific requirement concerning the magnitude of the static magnetic field to be applied as long as it is weaker than the weakest magnetic field which can break the superconducting state of the superconductors 111S1, 111S2, 112S1 and 112S2 included in the first Josephson device 111 and each second Josephson device 112k as well as that of the superconductor included in the first line 115, although the magnitude should preferably be as small as possible. For example, the magnetic field should preferably have a strength a flux equal to or less than the flux quantum multiplied by 5 that generates, in the partial superconducting circuit 113, and more preferably, a strength that generates a flux equal to or less than the flux quantum multiplied by 1 in the partial superconducting circuit 113. For example, a preferable magnitude of the static magnetic field is approximately 10 μT.

The first electromagnetic wave irradiator 151 is configured to select an electromagnetic wave which has one of the two frequencies of $|\omega 2-\omega 1|$ and $|\omega 2-\alpha 2-1\omega 1|$, and to irradiate the first superconducting circuit 11 with that electromagnetic wave. Although only a capacitor is shown as the first electromagnetic wave irradiator 151 in FIG. 1, this capacitor is connected to a microwave generator (not shown). The microwave supplied from this microwave generator is transmitted (applied) to the first superconducting circuit 11 via the capacitor.

In the first embodiment, the first electromagnetic wave irradiator 151 additionally has the function of irradiating the first superconducting circuit 11 with an electromagnetic wave having the first resonance frequency @1 so as to evaluate the quantum gate device 10. The second electromagnetic wave irradiator 152 has the function of irradiating the second superconducting circuit 12 with an electromagnetic wave having the second resonance frequency @2 so as to evaluate the quantum gate device 10. These functions are not essential functions in the quantum gate device according to the present invention.

The quantum gate device 10 according to the first embodiment further includes a first readout cavity 171 connected to the first supercomputing circuit 11, and a second readout cavity 172 connected to the second supercomputing circuit 12. Capacitors 161 and 162 are respectively provided between the first superconducting circuit 11 and the first readout cavity 171 as well as between the second superconducting circuit 12 and the second readout cavity 172.

In addition, the quantum gate device 10 has a cooling system (not shown) for cooling the superconductors included in the first superconducting circuit 11, second superconducting circuit 12 and connector 13 to a temperature equal to or lower than the superconductive transition temperature.

Figure 3:
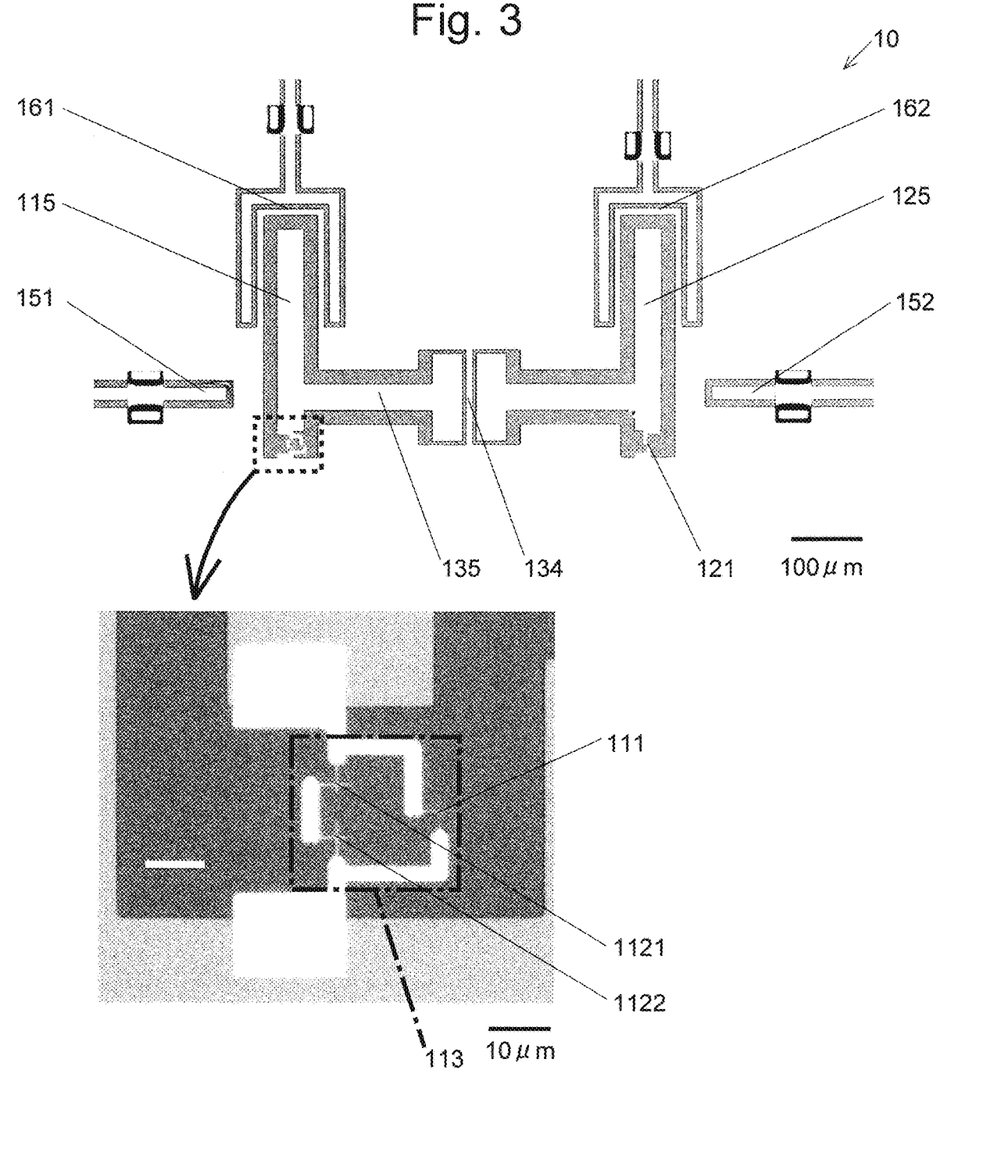
FIG. 3 is a microphotograph showing an actually created example of the quantum gate device according to the first embodiment, and a partially enlarged view of the same photograph.

FIG. 3 shows an actually created example of the quantum gate device according to the first embodiment by a microphotograph. It should be noted that the magnetic field applier 14 among the components of the quantum gate device 10 is not shown in FIG. 3; it is located at a position separated from the partial superconducting circuit 113 in a perpendicular direction to the sheet of the drawing. In FIG. 3, the upper section shows the entire quantum gate device 10, along with the lower section which shows an enlarged view of the portion surrounded by the broken line in the upper section. The areas surrounded by the gray lines darker than the pale gray of the background in FIG. 3 represent the areas where the surface of the substrate made of silicon is exposed. The pale gray areas are made of niobium, while the white areas are made of aluminum. Niobium and aluminum are superconductors. Though not visible in this microphotograph, aluminum oxide, or alumina, is used as the material of the thin film made of an insulator included in each Josephson device. It should be noted that the reference signs for the first and second capacitors 114 and 124 are omitted in FIG. 3; the first capacitor 114 is formed between the first line 115 and the ground, while the second capacitor 124 is formed between the second line 125 and the ground.

The superconductors and insulator available in the present invention are not limited to these examples; any appropriate material can be used.

(2) Operation of Quantum Gate Device According to First Embodiment

An operation of the quantum gate device 10 according to the first embodiment is hereinafter described. Initially, the quantum gate device 10 is cooled to a temperature equal to or lower than the superconductive transition temperature by the cooling system, and the static magnetic field is applied from the magnetic field applier 14 to the partial superconducting circuit 113.

In the case of the SWAP gate, when the energy state of the first superconducting circuit 11 is e1 and that of the second superconducting circuit 12 is g2 (these states are denoted by "e1g2"), or when the energy state of the first superconducting circuit 11 is g1 and that of the second superconducting circuit 12 is e2 ("g1e2"), an electromagnetic wave having a difference frequency $|\omega2-\omega1|$ is transmitted from the first electromagnetic wave irradiator 151 to the first superconducting circuit 11. The resonance frequency is thereby modulated, causing the first and second superconducting circuits 11 and 12 to interact with each other, so that the combination of the energy states of the two superconducting circuits alternates between the two states e1g2 and g1e2 with a predetermined period. Therefore, by performing the irradiation with the electromagnetic wave having a difference frequency $|\omega2-\omega1|$ for a half-integral multiple of that period, the device can be changed from one of the two states g1e2 and e1g2 to the other. This type of operation corresponds to the SWAP gate.

Figure 4A:
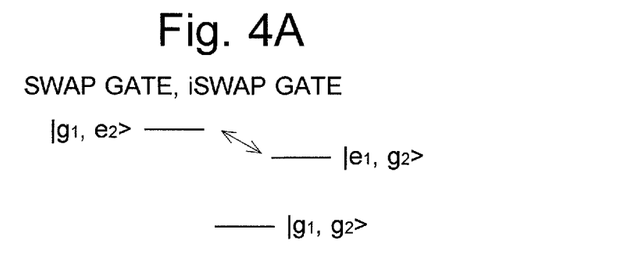
FIG. 4A is a diagram illustrating the transition of the energy state in the quantum gate device according to the first embodiment, the diagram showing a SWAP gate and iSWAP gate.
Figure 4B:
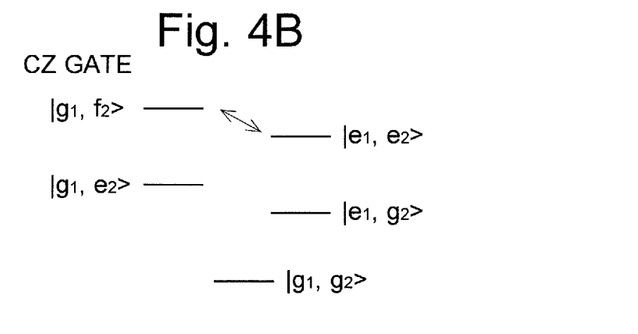
FIG. 4B is a diagram illustrating the transition of the energy state in the quantum gate device according to the first embodiment, the diagram showing a CZ gate.
Figure 5:
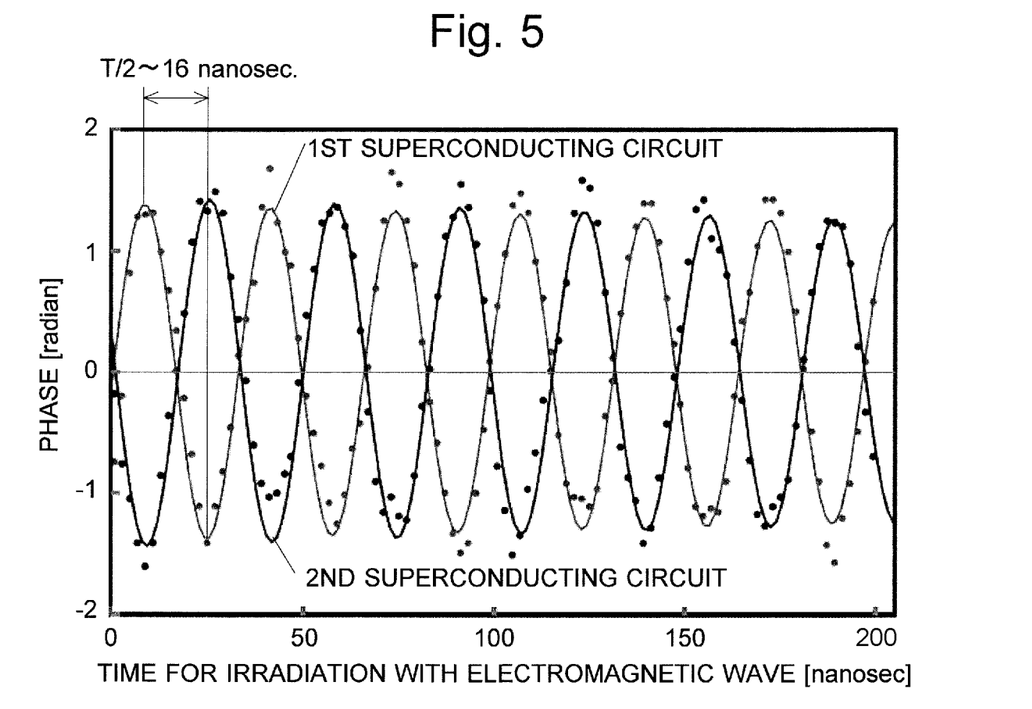
FIG. 5 is a graph showing the result of an experiment in which the energy states of the first and second superconducting circuits irradiated with an electromagnetic wave of a predetermined frequency for a predetermined period of time were measured in the quantum gate device according to the first embodiment.

FIG. 5 shows the result of an experiment in which the energy states of the first and second superconducting circuits 11 and 12 in the quantum gate device 10 shown in FIG. 3 were measured after the electromagnetic wave having a difference frequency $|\omega2-\omega1|$ was transmitted from the first electromagnetic wave irradiator 151 for a predetermined irradiation period, with the irradiation period gradually varied. In the experiment, in order to initially create the state of e1g2 or g1e2, the first superconducting circuit 11 was irradiated with an electromagnetic wave having the first resonance frequency $\omega1$ from the first electromagnetic wave irradiator 151, or the second superconducting circuit 12 was irradiated with an electromagnetic wave having the second resonance frequency $\omega2$ from the second electromagnetic wave irradiator 152, and the irradiation with the electromagnetic wave having a difference frequency $|\omega2-\omega1|$ was subsequently performed. In FIG. 5, the circuit is in the ground state (g1 or g2) within the area where the ordinate value is negative, while the circuit is in the first excited state (e1 or e2) within the area where the ordinate value is positive. The experimental result shows that, when one of the first and second superconducting circuits 11 and 12 is in the ground state, the other circuit is in the first excited state. In other words, the energy state of this quantum gate device 10 changes so that it alternates between the two states e1g2 and g1e2 during the irradiation with the electromagnetic wave (FIG. 4A). With T denoting the period of this change in energy state, the period of time T/2 required for a change from one state to the other is approximately 16 nanoseconds according to the experimental result shown in FIG. 5. In general, conventional quantum gate devices employing transmons or similar circuits require more than 100 nanoseconds for a change between two states. By contrast, the transition between the two states according to the first embodiment occurs with a shorter period of time (at higher speeds) than in the conventional cases. It should be noted that the depiction in FIGS. 4A and 4B (which will be described later) assumes that the energy state g1e2 is higher than e1g2, although the energy state e1g2 can be higher than g1e2 depending on the configuration of the first and second superconducting circuits 11 and 12.

In the quantum gate device 10 according to the first embodiment, when the phase of the electromagnetic wave transmitted to the first superconducting circuit 11 and/or the second superconducting circuit 12 is changed by 90 degrees, the ground state and the first excited state are exchanged between the first and second superconducting circuits 11 and 12, and additionally, the phase is inverted in one of the first and second superconducting circuits 11 and 12. That is to say, the device can be operated as an iSWAP gate which changes the state from g1e2 to ie1g2, or from e1g2 to ig1e2.

The quantum gate device 10 according to the first embodiment can also be operated as a CZ gate. In the case of the CZ gate, an electromagnetic wave having a difference frequency $|\omega2-\alpha2-\omega1|$ is transmitted from the first superconducting circuit 11 to the first electromagnetic wave irradiator 151 under the condition that the combination of the energy states of the two superconducting circuits is e1e2. This makes the device alternately take the two states e1e2 and g1f2 (FIG. 4B), where f2 means that the second superconducting circuit 12 is in the second excited state. When the state is changed from e1e2 to g1f2 by this operation and then directly returned from g1f2 to e1e2, a phase is gained and the state changes to −e1e2. This type of operation corresponds to the CZ gate.

Thus, three types of operations of the quantum gate, i.e., the SWAP gate, iSWAP gate and CZ gate, can be performed by the quantum gate device 10 according to the first embodiment.

An experiment for confirming the correctness of the gate operation in the quantum gate device 10 shown in FIG. 3 was performed by a method called a random benchmark test, with the device operated as each of the SWAP, iSWAP and CZ gates. The results demonstrated that the operation of the quantum gate was correctly performed with a probability of 99.3% for the SWAP gate, 99.2% for the iSWAP gate and 99.1% for the CZ gate. That is to say, the error occurrence rate in these types of quantum gate operation is reduced to less than 1%. When the quantum gate device 10 with the error occurrence rate thus reduced is implemented in a quantum computer, the device can be satisfactorily operated with the help of an error correction mechanism. Furthermore, the reduction in the amount of processing for the correction improves the performance of the quantum computer.

It should be noted that, in the previous descriptions of the quantum gate device 10 according to the first embodiment, the residual interaction which occurs between the electrons possessed by the first superconducting circuit 11 and those possessed by the second superconducting circuit 12 after the operation as the SWAP gate, iSWAP gate or CZ gate has been disregarded on the assumption that this interaction is adequately weak.

(3) Quantum Gate Device According to Second Embodiment of Present Invention

Figure 6:
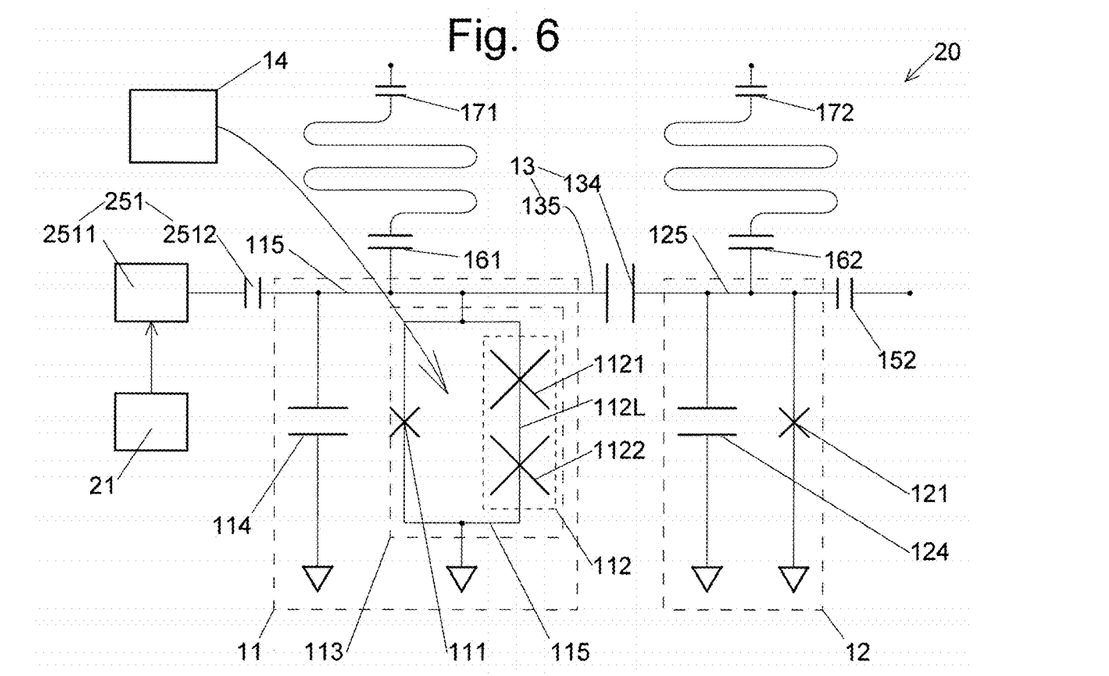
FIG. 6 is a schematic configuration diagram showing the second embodiment of the quantum gate device according to the present invention.

FIG. 6 is a diagram showing a schematic of the configuration of a quantum gate device 20 according to the second embodiment of the present invention. The configuration of this quantum gate device 20 is identical to the quantum gate device 10 according to the first embodiment except that the first electromagnetic wave irradiator (electromagnetic wave irradiator) 151 is replaced by a residual-interaction-cancelling electromagnetic wave irradiator 251 doubling as the first electromagnetic wave irradiator (electromagnetic wave irradiator) which will be described later, and that an irradiation coordinator 21 is added. Accordingly, the components except for the residual-interaction-cancelling electromagnetic wave irradiator 251 doubling as the first electromagnetic wave irradiator and the irradiation coordinator 21 are identical in configuration to those of the quantum gate device 10 according to the first embodiment, and therefore, will not be described in detail.

The residual-interaction-cancelling electromagnetic wave irradiator 251 doubling as the first electromagnetic wave irradiator includes a microwave generator 2511 and a capacitor 2512. The microwave generator 2511 generates an electromagnetic wave (microwave) having one of the three frequencies of $|\omega2-\omega1|$, $|\omega2-\alpha2-\omega1|$ and $\omega1$. In the residual-interaction-cancelling electromagnetic wave irradiator 251 doubling as the first electromagnetic wave irradiator, the electromagnetic wave generated by the microwave generator 2511 is transmitted (applied) to the first superconducting circuit 11 through the capacitor 2512. Among the three aforementioned frequencies, $|\omega2-\omega1|$ and $|\omega2-\alpha2-\omega2|$ are used when the residual-interaction-cancelling electromagnetic wave irradiator 251 doubling as the first electromagnetic wave irradiator is made to function as the electromagnetic wave irradiator described earlier, while $\omega1$ is used when the residual-interaction-cancelling electromagnetic wave irradiator 251 doubling as the first electromagnetic wave irradiator is made to function as the residual-interaction-cancelling electromagnetic wave irradiator described earlier.

The irradiation coordinator 21 is configured to control the timing of the electromagnetic-wave irradiation by the residual-interaction-cancelling electromagnetic wave irradiator 251 doubling as the first electromagnetic wave irradiator. According to the operation of the irradiation coordinator 21, the residual-interaction-cancelling electromagnetic wave irradiator 251 doubling as the first electromagnetic wave irradiator produces an electromagnetic wave having a frequency of $|\omega2-\omega1|$ or $|\omega2-\alpha2-\omega1|$ when it functions as the electromagnetic wave irradiator, or produces a residual-interaction-cancelling electromagnetic wave having a frequency of $\omega1$ two times at a predetermined interval of time when it functions as the residual-interaction-cancelling electromagnetic wave irradiator. As an example of the residual-interaction-cancelling electromagnetic wave, a pulsed electromagnetic wave having a pulse width corresponding to the period of time for inverting the phase of the qubit in the first superconducting circuit 11 ($\pi$ pulse or 180-degree pulse) can be used.

Figure 7:
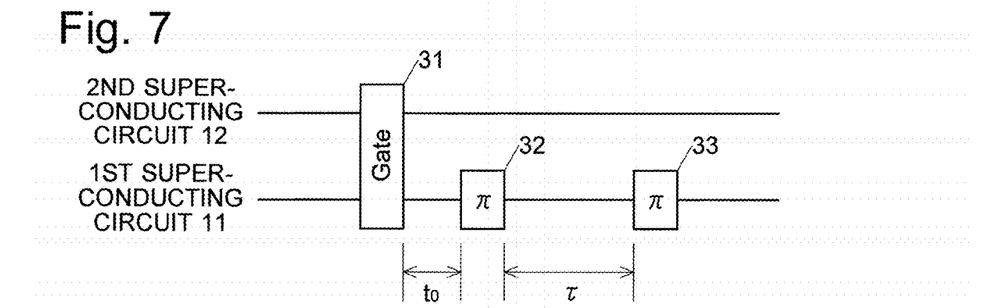
FIG. 7 is a sequence diagram showing an operation of the quantum gate device according to the second embodiment.

An operation of the quantum gate device 20 according to the second embodiment is hereinafter described using FIG. 7. FIG. 7 shows operations which occur at each point in time in the first and second superconducting circuits 11 and 12 with the passage of time from left to right. The quantum gate device 20 performs an operation for cutting off the residual interaction after the operation of the quantum gate, as will be hereinafter described.

The operation of the quantum gate in the quantum gate device 20 is identical to the operation in the quantum gate device 10 according to the first embodiment regardless of whether it is operated as a SWAP gate, iSWAP gate or CZ gate. That is to say, the quantum gate device 20 is cooled to a temperature equal to or lower than the superconductive transition temperature by the cooling system, and a static magnetic field is applied from the magnetic field applier 14 to the partial superconducting circuit 113. Subsequently, an electromagnetic wave having a predetermined difference frequency is transmitted from the residual-interaction-cancelling electromagnetic wave irradiator 251 doubling as the first electromagnetic wave irradiator to the first superconducting circuit 11. The difference frequency is $|\omega2-\omega1|$ for the SWAP gate and iSWAP gate, and $|\omega2-\alpha2-\omega1|$ for the CZ gate. Consequently, the operation of the quantum gate (reference sign "31" in FIG. 7) occurs in the first and second superconducting circuits 11 and 12, as in the first embodiment.

After a first predetermined period of time $t_0$ has passed since the operation of the quantum gate, a first residual-interaction-cancelling electromagnetic wave 32 having a frequency of $\omega1$ is transmitted from the residual-interaction-cancelling electromagnetic wave irradiator 251 doubling as the first electromagnetic wave irradiator to the first superconducting circuit 11, whereby the phase of the qubit in the first superconducting circuit 11 is inverted, and the residual interaction with the second superconducting circuit 12 is broken. Subsequently, after a second predetermined period of time $\tau$ has passed since the transmission of the first residual-interaction-cancelling electromagnetic wave 32, a second residual-interaction-cancelling electromagnetic wave 33 having a frequency of $\omega1$ is transmitted to the first superconducting circuit 11, whereby the phase of the qubit in the first superconducting circuit 11 is returned to its original state. By the operations described to this point, the residual interaction can be broken after the operation of the quantum gate has been performed.

There is no specific requirement concerning the length of the first predetermined period of time $t_0$. There is also no specific requirement concerning the length of the second predetermined period of time $\tau$, although it is preferable to determine it by performing a preliminary experiment, as will be hereinafter described.

Figure 8:
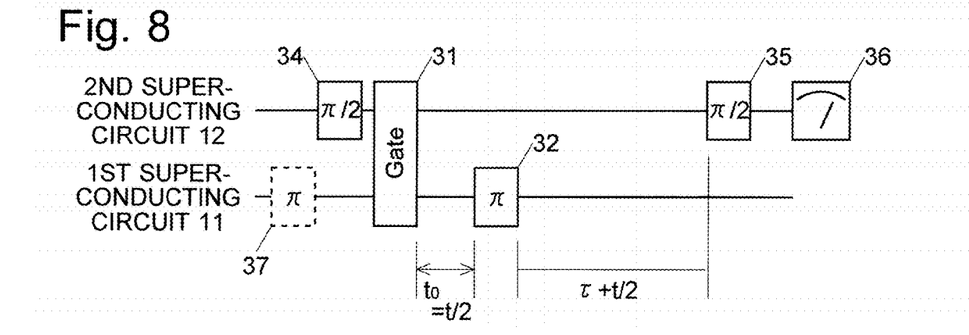
FIG. 8 is a sequence diagram showing an operation for a preliminary experiment in the quantum gate device according to the second embodiment.

An example of the preliminary experiment for determining the second predetermined period of time $\tau$ is hereinafter described using FIGS. 8 and 9. In the preliminary experiment according to this example, an electromagnetic wave 34 (see FIG. 8) which has a frequency of $\omega2$ and is tuned to change the phase of the qubit in the second superconducting circuit 12 by 90 degrees is transmitted from the second electromagnetic wave irradiator 152 to the second superconducting circuit 12. As this electromagnetic wave 34, a pulsed electromagnetic wave which is generally called a "$\pi/2$ pulse" or "90-degree pulse" and has conventionally been used for a spin echo method in a magnetic resonance measurement can be used. After the transmission of the electromagnetic wave 34, the operation 31 of the quantum gate is performed. There is no requirement concerning the length of time between the transmission of the electromagnetic wave 34 and the operation 31 of the quantum gate. Subsequently, after the first predetermined period of time $t_0$ (in the present case, this period is assumed to be "t/2") has passed since the operation 31 of the quantum gate, the first residual-interaction-cancelling electromagnetic wave 32 is transmitted. However, no second residual-interaction-cancelling electromagnetic wave 33 is subsequently transmitted. Instead, after the period of time $\tau+t/2$ has passed since the transmission of the first residual-interaction-cancelling electromagnetic wave 32, an electromagnetic wave (e.g., $\pi/2$ pulse) 35 which has a frequency of $\omega2$ and tuned to change the phase of the qubit in the second superconducting circuit 12 is transmitted from the second electromagnetic wave irradiator 152 to the second superconducting circuit 12. After the transmission of the electromagnetic wave 35, a measurement 36 of the output signal of the capacitor 162 is performed. The measurement described thus far is hereinafter called the "first preliminary experiment". The first preliminary experiment is performed for various values of t and τ.

Along with the first preliminary experiment, a second preliminary experiment is performed. In the second preliminary experiment, initially, an electromagnetic wave (e.g., π pulse) 37 which inverts the phase of the qubit in the first superconducting circuit 11 is transmitted from the residual-interaction-cancelling electromagnetic wave irradiator 251 doubling as the first electromagnetic wave irradiator to the first superconducting circuit 11 (as indicated by the broken line in FIG. 8). Subsequently, the operations from the transmission of the electromagnetic wave 34 to the measurement 36 of the output signal of the capacitor 162 are performed in a similar manner to the first preliminary experiment. There is no requirement concerning the length of time between the transmission of the electromagnetic wave 37 and that of the electromagnetic wave 34. The second preliminary experiment is performed for various values of t and τ.

Figure 9A:
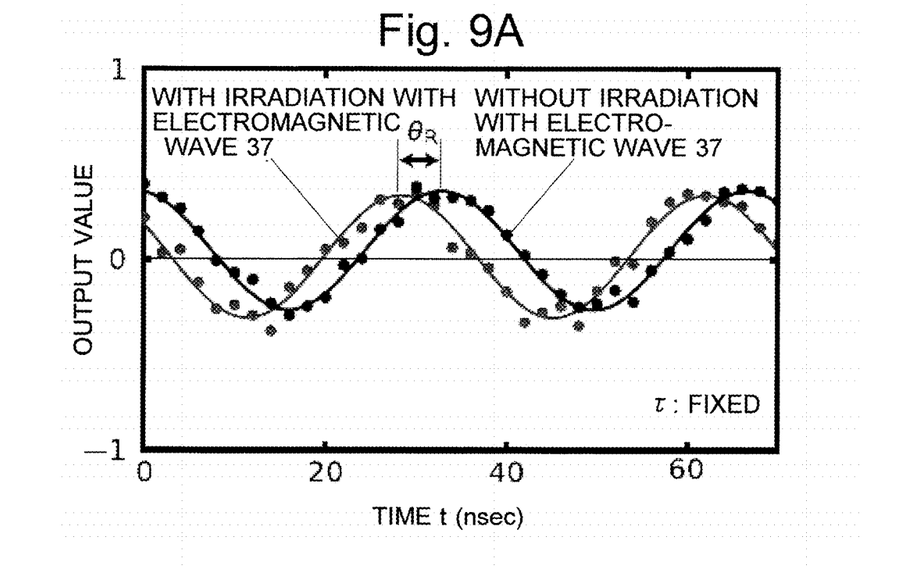
FIG. 9A is a graph showing data acquired in an example of the preliminary experiment for determining the time interval τ between two shots of residual-interaction-cancelling electromagnetic wave in the quantum gate device according to the second embodiment, with τ fixed at a specific value.

FIG. 9A shows the results of the first and second preliminary experiments performed for various values of t, with τ fixed at a specific value. The gate operation was performed for 34 nanoseconds in these preliminary experiments. The set of data with the annotation "without irradiation with electromagnetic wave 37" in FIG. 9A are data obtained through the first preliminary experiment, while the set of data with the annotation "with irradiation with electromagnetic wave 37" are data obtained through the second preliminary experiment. In both sets of data, the output value shows a sinusoidal change with the changing value of t. However, a phase difference $\theta_R$ occurs between the two sets of data.

Figure 9B:
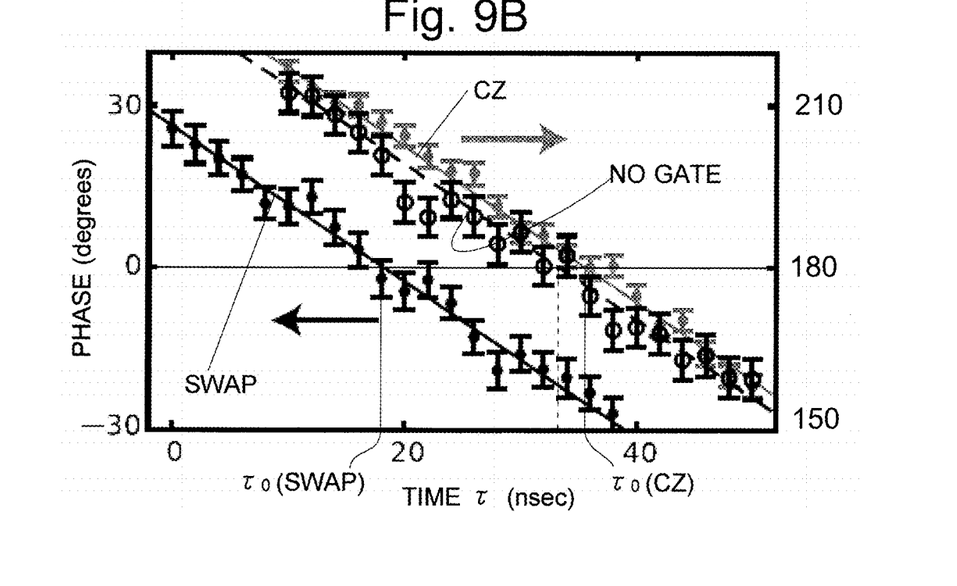
FIG. 9B is a graph showing an example of the final result of the preliminary experiment for determining τ.

By determining this phase difference $\theta_R$ for each of the various values of τ, a function expressing $\theta_R$ with τ as the variable can be obtained, as shown in FIG. 9B. FIG. 9B shows two negatively sloped solid lines, of which the left one is the function of $\theta_R$ in the case where the operation of a SWAP gate was performed, while the right one corresponds to the function of $\theta_R$ in the case where the operation of a CZ gate was performed. The negatively sloped broken line in FIG. 9B is the function of $\theta_R$ with no operation of the quantum gate. For these three functions, the values of $\theta_R$ with the SWAP-gate operation and those with no quantum-gate operation are indicated on the left-side vertical axis, while the values of $\theta_R$ with the CZ-gate operation are indicated on the right-side vertical axis. Each value of τ at which $\theta_R=0$ or 180 degrees (τ) in these functions is the optimum value $\tau_0$ of τ.

A random benchmark test for the quantum gate device 20 according to the second embodiment was performed, which demonstrated that the operation of the quantum gate was correctly performed with a probability of 97.3±0.1% for the SWAP gate, 97.2±0.1% for the iSWAP gate and 96.4±0.1% for the CZ gate. These values are lower (the error occurrence rates are higher) than in the first embodiment, which is most likely due to the fact that a certain amount of time is required for the operation of transmitting the residual-interaction-cancelling electromagnetic wave two times after the operation of the quantum gate.

Figure 10:
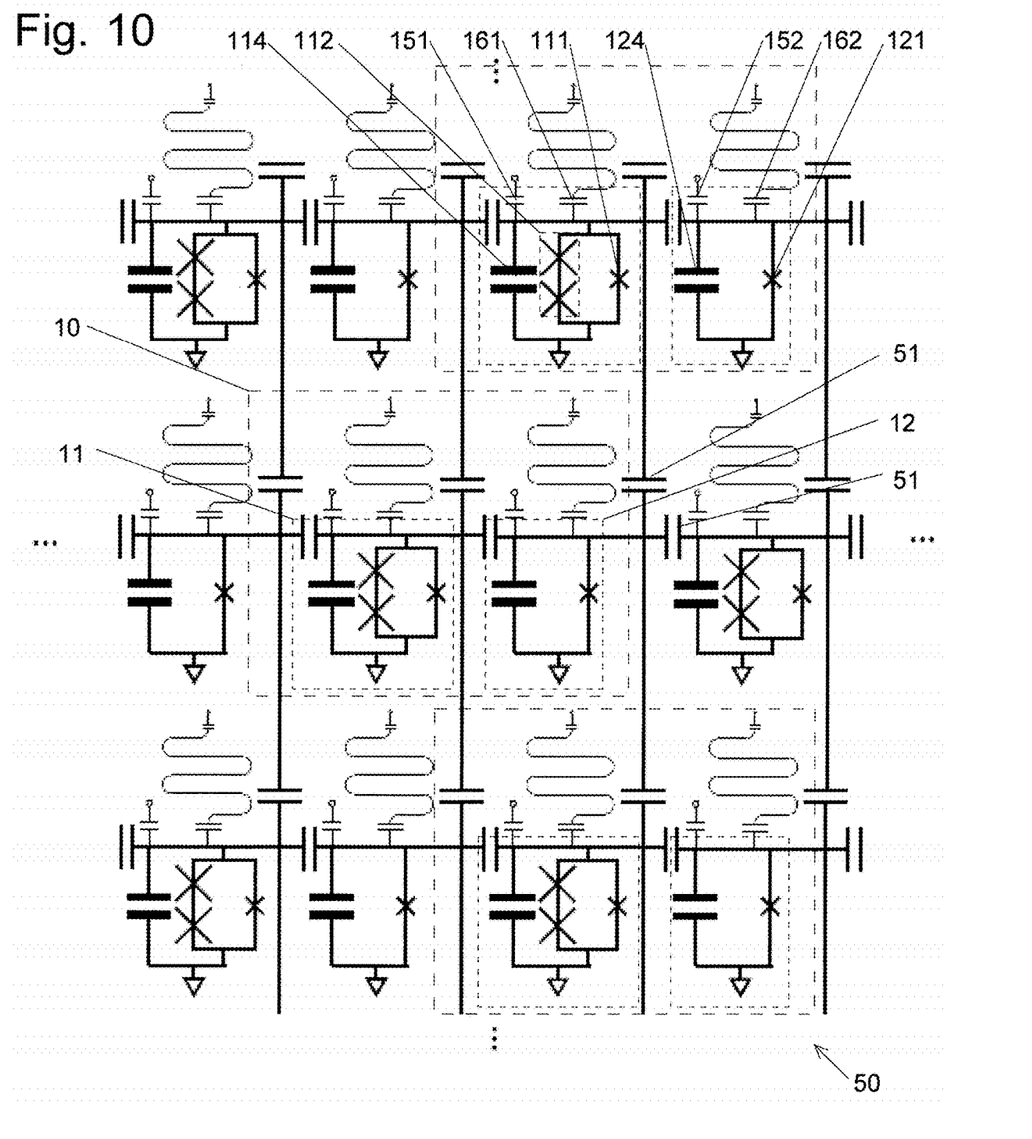
FIG. 10 is a schematic configuration diagram showing one example of an integrated quantum circuit in which a plurality of quantum gate devices according to the first embodiment are integrated.

(4) Example of Integrated Quantum Circuit in which Quantum Gate Devices According to Present Invention are Integrated FIG. 10 shows an example of the integrated quantum circuit in which a plurality of quantum gate devices 10 according to the first embodiment are integrated. This integrated quantum circuit 50 consists of a plurality of quantum gate devices 10 connected in a two-dimensional form (matrix form), in which each pair of quantum gate devices 10 neighboring each other are connected via a capacitor 51. Although the quantum gate devices 10 according to the first embodiment are used in the present example, a plurality of quantum gate devices 20 according to the second embodiment can also be integrated to construct an integrated quantum circuit.

(5) Modified Examples

Figure 11A:
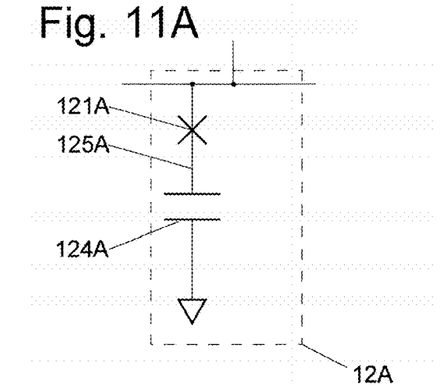
FIG. 11A is a diagram showing a charge qubit which can be used as the second superconducting circuit in a quantum gate device according to a modified example.
Figure 11B:
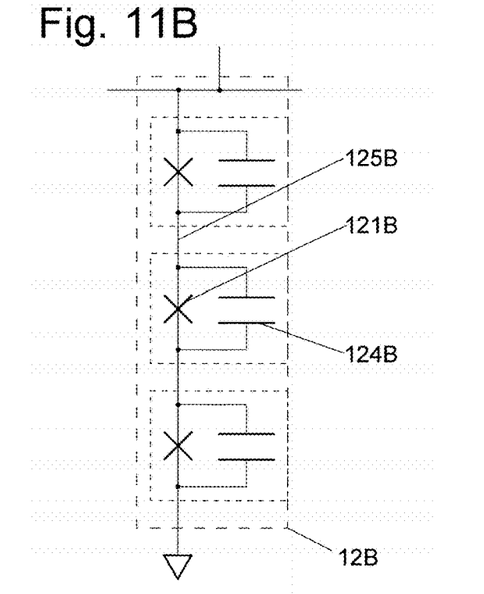
FIG. 11B is a diagram showing a flux qubit which can be used as the second superconducting circuit in a quantum gate device according to a modified example.
Figure 11C:
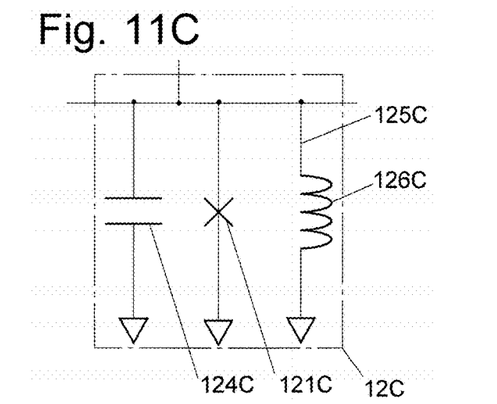
FIG. 11C is a diagram showing a fluxonium which can be used as the second superconducting circuit in a quantum gate device according to a modified example.

The present invention is not limited to the previously described embodiments. For example, although the second superconducting circuit 12 which is a transmon is used in the quantum gate devices 10 and 20 according to the first and second embodiments, the second superconducting circuit 12 may be replaced by any of the second superconducting circuits 12A, 12B and 12C shown in FIGS. 11A-11C. The second superconducting circuit 12A shown in FIG. 11A is a so-called charge qubit, in which a Josephson device 121A and a capacitor 124A are connected in series by a second line 125A made of a superconductor. The second superconducting circuit 12B shown in FIG. 11B is a so-called flux qubit, in which a plurality of (in the example of FIG. 11B, three) Josephson devices 121B are connected in series, with each Josephson device 121B having a capacitor 124B connected in parallel. The components of the second superconducting circuit 12B are connected by a second line 125B made of a superconductor. The second superconducting circuit 12C shown in FIG. 11C is a so-called fluxonium, in which a Josephson device 121C, capacitor 124C and coil 126C are connected in parallel by a second line 125C made of a superconductor.

In the quantum gate device 20 according to the second embodiment, in place of the residual-interaction-cancelling electromagnetic wave irradiator 251 doubling as the first electromagnetic wave irradiator, a first electromagnetic wave irradiator (e.g., the same one as the first electromagnetic wave irradiator 151 used in the quantum gate device 10 according to the first embodiment) and a residual-interaction-cancelling electromagnetic wave irradiator may be separately provided.

The electromagnetic wave irradiator (the first electromagnetic wave irradiator 151) and/or the residual-interaction-cancelling electromagnetic wave irradiator (the residual-interaction-cancelling electromagnetic wave irradiator 251 doubling as the first electromagnetic wave irradiator, or a residual-interaction-cancelling electromagnetic wave irradiator that does not double as the first electromagnetic wave irradiator) may be configured to irradiate only the first superconducting circuit with the electromagnetic wave, or to irradiate the second superconducting circuit with the electromagnetic wave in addition to the first superconducting circuit.

Furthermore, the configurations according to the embodiments and modified examples described so far can be combined. A plurality of quantum gate devices in which the configurations according to those embodiments and modi-

REFERENCE SIGNS LIST 10, 20 ... Quantum Gate Device
11 ... First Superconducting Circuit
111 ... First Josephson Device
111J ... First Thin Film
112 ... Second Josephson Device Group
1121, 1122 ... Second Josephson Device
112J ... Second Thin Film
112L ... Line
113 ... Partial Superconducting Circuit
114 ... First Capacitor
115 ... First Line
12, 12A, 12B, 12C ... Second Superconducting Circuit
121, 121A, 121B, 121C ... Josephson Device
124 ... Second Capacitor
124A, 124B, 124C, 161, 162, 21 ... Capacitor
125, 125A, 125B, 125C ... Second Line
126C ... Coil
13 ... Connector
134 ... Connector Capacitor
135 ... Third Line
14 ... Magnetic Field Applier
151 ... First Electromagnetic Wave Irradiator (Electromagnetic Wave Irradiator)
152 ... Second Electromagnetic Wave Irradiator
171 ... First Readout Cavity
172 ... Second Readout Cavity
21 ... Irradiation Coordinator
251 ... Residual-Interaction-Cancelling Electromagnetic Wave Irradiator Doubling as First Electromagnetic Wave Irradiator (Electromagnetic Wave Irradiator)
2511 ... Microwave Generator
2512 ... Capacitor in Residual-Interaction-Cancelling Electromagnetic Wave Irradiator Doubling as First Electromagnetic Wave Irradiator
31 ... Operation of Quantum Gate
32 ... First Residual-Interaction-Cancelling Electromagnetic Wave
33 ... Second Residual-Interaction-Cancelling Electromagnetic Wave
34, 35, 37 ... Electromagnetic Wave in Preliminary Experiment
36 ... Measurement of Output Signal
50 ... Integrated Quantum Circuit
51 ... Capacitor

The invention claimed is:

1. A quantum gate device, comprising:
a) a first superconducting circuit configured to resonate at a first resonance frequency, the first superconducting circuit including:
a-1) a first Josephson device which is a single Josephson device;
a-2) a second Josephson device group in which n Josephson devices are connected in series by a line made of a superconductor, where each of the n Josephson devices has a Josephson energy greater than n times a Josephson energy of the first Josephson device;
a-3) a first capacitor; and
a-4) a first line made of a superconductor and configured to form a partial superconducting circuit by connecting the first Josephson device and the second Josephson device group in a ring-like form, as well as to connect the partial superconducting circuit and the first capacitor in parallel;
b) a second superconducting circuit configured to resonate at a second resonance frequency, including at least one Josephson device, a second capacitor, and a second line made of a superconductor;
c) a connector configured to connect the first superconducting circuit and the second superconducting circuit, including a connector capacitor as well as a third line made of a superconductor and connected to each of two poles of the connector capacitor;
d) a magnetic field applier configured to apply a static magnetic field to the partial superconducting circuit; and
e) an electromagnetic wave irradiator configured to irradiate the first superconducting circuit with an electromagnetic wave having a difference frequency which is equal to a difference between the first resonance frequency and the second resonance frequency.

2. The quantum gate device according to claim 1, wherein the second superconducting circuit is a transmon including one Josephson device and one second capacitor connected by the second line in a ring-like form.

3. An integrated quantum circuit, comprising a plurality of quantum gate devices according to claim 2.

4. The quantum gate device according to claim 1, wherein:
the first Josephson device is a device in which a junction having a first thin film made of an insulator is sandwiched between two superconductors;
each of the Josephson devices constituting the second Josephson device group is a device in which a junction having a second thin film made of the same insulator as the first thin film is sandwiched between two superconductors; and
a value of a tunnel resistance in the first Josephson device is greater than n times a value of a tunnel resistance in each of the Josephson devices constituting the second Josephson device group.

5. An integrated quantum circuit, comprising a plurality of quantum gate devices according to claim 4.

6. The quantum gate device according to claim 1, further comprising:
a residual-interaction-cancelling electromagnetic wave irradiator configured to irradiate the first superconducting circuit with a residual-interaction-cancelling electromagnetic wave which is an electromagnetic wave which inverts a phase of a qubit; and
an irradiation coordinator configured to coordinate a timing of irradiation by the electromagnetic wave irradiator and the residual-interaction-cancelling electromagnetic wave irradiator so that an irradiation with the electromagnetic wave by the electromagnetic wave irradiator is performed, and subsequently, an irradiation with the residual-interaction-cancelling electromagnetic wave by the residual-interaction-cancelling electromagnetic wave irradiator is performed two times with a predetermined interval of time.

7. The quantum gate device according to claim 6, wherein the residual-interaction-cancelling electromagnetic wave irradiator is a same device as the electromagnetic wave irradiator.

8. An integrated quantum circuit, comprising a plurality of quantum gate devices according to claim 7.

9. An integrated quantum circuit, comprising a plurality of quantum gate devices according to claim 6.

10. An integrated quantum circuit, comprising a plurality of quantum gate devices according to claim 1.

* * * * *